United States Patent [19]

Yoshino

[11] Patent Number: 5,514,983
[45] Date of Patent: May 7, 1996

[54] CMOS FULL DUPLEX TRANSMISSION-RECEPTION CIRCUIT

[75] Inventor: Ryozo Yoshino, Hadano, Japan

[73] Assignee: Hitachi, Ltd., Tokyo, Japan

[21] Appl. No.: 360,325

[22] Filed: Dec. 21, 1994

[30] Foreign Application Priority Data

Dec. 28, 1993 [JP] Japan .................................. 5-334628

[51] Int. Cl.$^6$ .......................................... H03K 19/0175
[52] U.S. Cl. .............................. 326/86; 326/30; 327/541
[58] Field of Search ................................ 326/30, 83, 86; 327/541, 543

[56] References Cited

U.S. PATENT DOCUMENTS

| | | | |
|---|---|---|---|
| 4,797,582 | 1/1989 | Nguyen | 326/30 |
| 5,084,637 | 1/1992 | Gregor | 326/30 |
| 5,248,906 | 9/1993 | Mahmood | 326/86 |
| 5,371,424 | 12/1994 | Quigley | 326/86 |

OTHER PUBLICATIONS

"Simultaneous Bidirectional Signalling or IC Systems", ICCD Thesis in 1990, Lam et al, pp. 430–433.

Primary Examiner—Edward P. Westin
Assistant Examiner—Andrew Sanders
Attorney, Agent, or Firm—Fay, Sharpe, Beall, Fagan, Minnich & McKee

[57] ABSTRACT

The data input/output circuit for full duplex communication includes a data accepting and sending circuit which has an input/output terminal connected to a processor provided within a digital apparatus, and which receives data from the processor, transmits the data and receives outside data through the input/output terminal, a reference circuit which divides a voltage level of the data transmitted from the data accepting and sending circuit and produces a divided voltage level, a differential receiving circuit which has one input terminal connected to the input/output terminal and another input terminal connected to the reference circuit, and which is not operated by a zero voltage difference between the input terminals when the data is transmitted from the input/output terminal but operated by a voltage difference between the input terminals when the data is received through the input/output terminal, the data being supplied to the processor of the digital apparatus, a reference circuit for generating an output impedance value of the data accepting and sending circuit, and a voltage regulation circuit for adjusting a power supply voltage to be applied to the data accepting and sending circuit so that the output impedance value is changed in accordance with the value of the output impedance. This data input/output circuit can be incorporated in an LSI of CMOS transistor structure and has a simple circuit arrangement capable of impedance matching with the transmission path.

21 Claims, 4 Drawing Sheets

DRAIN VOLTAGE / CURRENT CHARACTERISTICS

CM OS FULL DUPLEX TRANSMISSION-RECEPTION CIRCUIT

BACKGROUND OF THE INVENTION

This invention relates to a transmission-reception circuit including data input/output circuits for full duplex communication, and particularly to a data input/output circuit, which is easy to be incorporated in an LSI which digital apparatus has, or is suited to be constructed in, a CMOS-LSI which includes a data input/output buffer for data input and output and so on.

An example of the full duplex receiving circuit constructed within a CMOS-LSI is described in the Proceedings of ICCD, 1990, pp.430–433, "Simultaneous Bidirectional Signalling for IC Systems" by Kevin Lam, Larry R. Dennison, William J. Dally and others.

In the transmitting circuit according to the above document, the terminal circuit is formed by MOS resistance of the region in which the drain current-voltage characteristic curve rises up from zero because of the necessity for impedance matching between the current drive type transmitting circuit and the transmission path. The receiving circuit has a sense amplifier formed of a CMOS circuit, and constitutes a full duplex transmitting and receiving circuit together with the above transmitting circuit and another transmitting circuit for a reference circuit.

According to the above document, since bidirectional transmission can be made on a single signal line, the number of signal lines can be reduced. However, since the terminal resistance must match the characteristic impedance of the transmission path, the current drive type driver and the parallel terminal MOS resistance are used to constitute the terminal circuit. Therefore, correction circuits are required to correct the terminal resistance and the output current variation of the current drive type driver due to the dispersion in the LSI manufacturing process.

SUMMARY OF THE INVENTION

It is an object of the invention to provide a data input/output circuit which has a simple circuit arrangement capable of adjusting the output impedance of the transmitting path, and which can be small sized.

As will be understood from the embodiments of the invention, according to a first aspect of the invention a data input/output circuit for full duplex communication has a data accepting and sending circuit which has an input/output terminal connected to a data processor provided within the digital apparatus, and which receives transmitted data from the data processor, transmits the data and receives received data from the outside through the input/output terminal. A threshold reference circuit divides a voltage level of the data transmitted from the data accepting and sending circuit and produces a divided certain voltage level. A differential receiving circuit has one input terminal connected to the input/output terminal and the other input terminal connected to the threshold reference circuit. The differential receiving circuit is not operated by a zero voltage difference between the one input terminal and the other input terminal when the data is transmitted from the input/output terminal, but is operated by a voltage difference between the one input terminal and the other terminal when the data from the outside is received through the input/output terminal, the received data being supplied to the data processor of the digital apparatus. Further, an output impedance reference circuit for generating a certain value of the output impedance of the data accepting and sending circuit, and a voltage regulation circuit for adjusting at least a power supply voltage to be applied to the data accepting and sending circuit, are provided so that an output impedance value of the data accepting and sending circuit is changed in accordance with the certain value of the output impedance.

The data accepting and sending circuit has two CMOS transistors connected in parallel with an input terminal for receiving the transmitted data from the data processor, wherein the output end of one CMOS transistor is connected to the gate of a first PMOS transistor, the output end of the other CMOS transistor is connected to the gate of a first NMOS transistor, and the drain of the first PMOS transistor and the drain of the first NMOS transistor are connected together at the input/output terminal.

The threshold reference circuit includes a second PMOS transistor having its gate connected to the gate of the first PMOS transistor and a second NMOS transistor having its gate connected to the gate of the first NMOS transistor. The drain of the second PMOS transistor and the drain of the second NMOS transistor are connected together at a first connection point, the source of the first PMOS transistor and the source of the second PMOS transistor are connected together at a power supply, and the source of the first NMOS transistor and the source of the second NMOS transistor are connected together at another power supply. Further, the threshold reference circuit also has a third PMOS transistor and a third NMOS transistor, wherein the drain of the third PMOS transistor and the drain of the third NMOS transistor are connected together at a second connection point and the second connection point is connected to the first connection point, so that a voltage level of the transmitted data from the input/output terminal is divided at the second connection point.

The differential receiving circuit is a differential amplifier which has a +input terminal connected to the input/output terminal and a −input terminal connected to the second connection point, and which is operated by a voltage difference between the +input terminal and the −input terminal when the received data is received at the input/output terminal, so that the received data is supplied to the data processor of the digital apparatus. However, when data is transmitted from the input/output terminal, the differential receiving circuit is not operated by a zero difference voltage between a voltage level of the transmitted data and a divided part of the voltage level of the transmitted data which is produced at the second connection point.

The output impedance reference circuit has a fourth PMOS transistor with a reference resistance Rr connected to its drain, and a fourth NMOS transistor with a reference resistance connected to its drain, so that a voltage is developed across each reference resistance in accordance with a voltage applied to each gate.

The voltage regulation circuit has a fifth NMOS transistor and sixth NMOS transistor, the source of the fifth NMOS transistor and the drain of the sixth NMOS transistor being connected together at a third connection point; a first differential amplifier having a −input terminal connected to the third connection point and a +input terminal connected to the drain of the fourth PMOS transistor; and a second differential amplifier having a −input terminal connected to the third connection point and a +input terminal connected to the drain of the fourth NMOS transistor. The output voltage from the first differential amplifier is negatively fed back to the gate of the fourth PMOS transistor and supplied as a power supply voltage to the one CMOS transistor, and the output voltage from the second differential amplifier is negatively fed back to the gate of the fourth NMOS transistor and supplied as a power supply voltage to the other CMOS transistor.

The output voltage from the first differential amplifier is also applied to the gate of the third PMOS transistor, and the output voltage from the second differential amplifier to the gate of the third NMOS transistor.

According to a second aspect, the data processor is formed of an output buffer circuit of CMOS structure which temporarily stores data transmitted from the digital apparatus, and an input buffer circuit of CMOS structure which temporarily stores data received from external digital apparatus. The output buffer circuit and input buffer circuit of CMOS structure are incorporated in a single LSI (Large-Scale Integrated circuit) together with the data accepting and sending circuit, the threshold reference circuit, the differential receiving circuit, the output impedance reference circuit and the voltage regulation circuit.

The above data input/output circuit for full duplex communication is so constructed as to be incorporated in an LSI of CMOS transistor structure. In addition, since the on-resistance of the output transistor in the data accepting and sending circuit can be adjusted, the data input/output circuit can be always operated in the impedance-matched state with respect to the transmission path even if the on-resistance of the MOS transistor is greatly changed by the dispersion of characteristics in the semiconductor manufacturing process or LSI production process. Moreover, its circuit arrangement is easy to control and has a small number of elements.

DESCRIPTION OF THE PREFERRED EMBODIMENTS

Figures 1A, 1B:
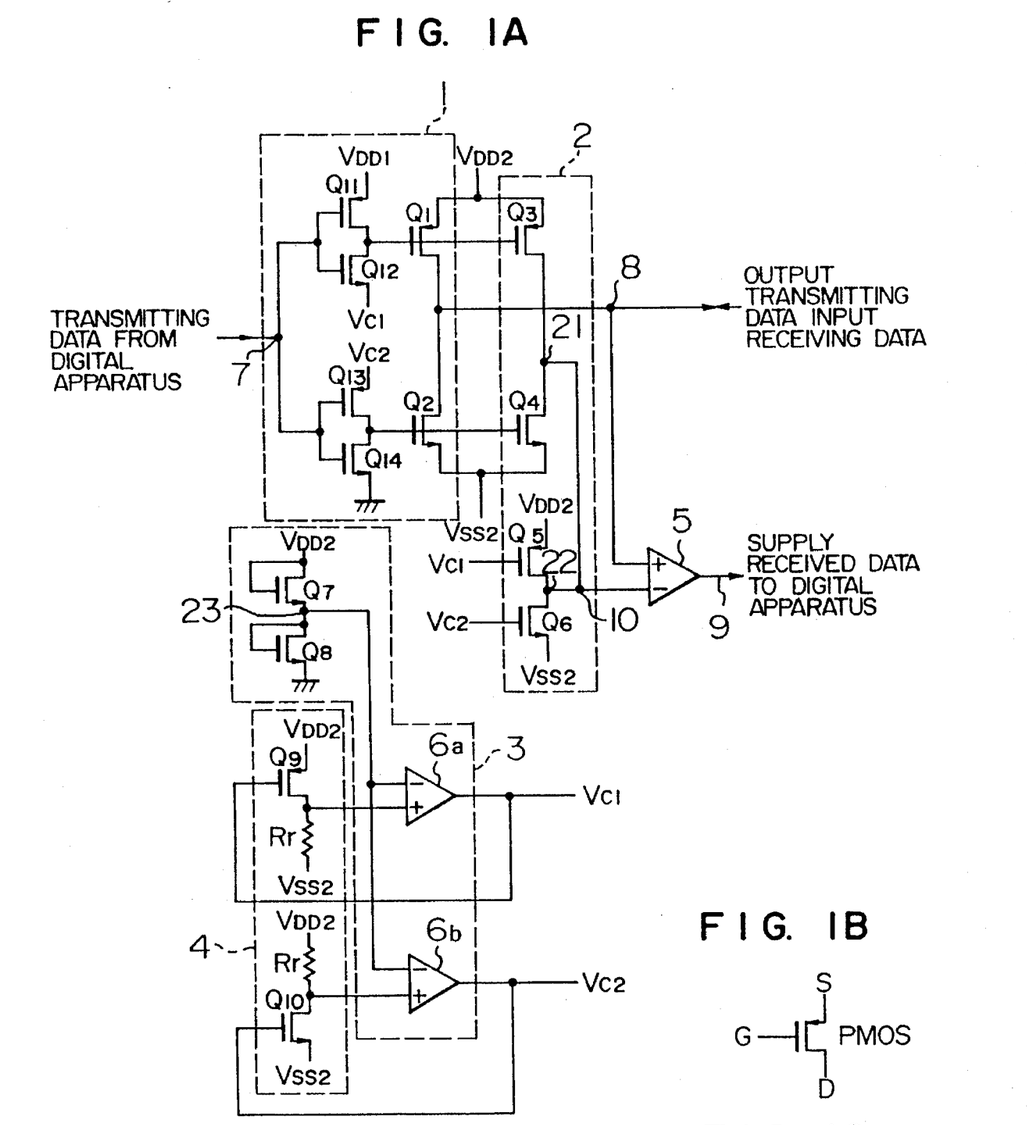
FIG. 1A is a circuit diagram of the data input/output circuit of the first embodiment of the invention.
FIG. 1B shows the symbol of the PMOS transistor.
Figure 1C:
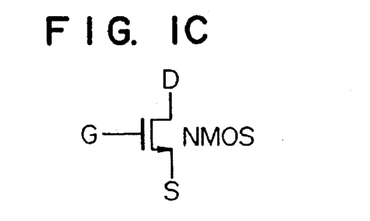
FIG. 1C shows the symbol of the NMOS transistor.

FIG. 1A is a circuit diagram of the full duplex communication data input/output circuit of the first embodiment of the invention, which input/output circuit is formed by CMOS. Here, the symbols of PMOS and NMOS are shown in FIGS. 1B and 1C, respectively, and in these figures S, G and D represent the source, gate and drain of the MOS transistor, respectively. The full duplex communication purpose data input/output circuit of the invention is used for, for example, making full duplex data transmission between one data processor and another data processor which are provided within a single digital apparatus. The input/output circuit is provided in the data input/output portions of each data processor. These input/output circuits are interconnected through a single transmission path. It is also possible that the data input/output circuits are used not only within a single digital apparatus but also in two digital apparatus which are separated, for example, 3 or 4 m and connected by a transmission path, in order to make data transmission between two apparatus.

Referring to FIG. 1A, the data input/output circuit includes a data accepting and sending circuit 1, a threshold reference circuit 2, a voltage regulation circuit 3, an output impedance reference circuit 4 and a differential receiving circuit 5.

The data accepting and sending circuit 1 is formed of output transistors $Q_1$, $Q_2$, transistors $Q_{11}$, $Q_{12}$ constituting a CMOS inverter, and transistors $Q_{13}$, $Q_{14}$ constituting a CMOS inverter.

The threshold reference circuit 2 is formed of a transistor $Q_3$ which is driven by the CMOS inverter $Q_{11}$, $Q_{12}$ of the data accepting and sending circuit 1, a transistor $Q_4$ which is driven by the CMOS inverter $Q_{13}$, $Q_{14}$, and load transistors $Q_5$, $Q_6$ which serve as loads of transistors $Q_3$, $Q_4$. The drains of transistors $Q_3$ and $Q_4$ are connected at a first connection point 21. The drains of transistors $Q_5$ and $Q_6$ are connected at a second connection point 22.

The voltage regulation circuit 3 is formed of differential amplifier circuits 6a, 6b and a voltage divider of transistors $Q_7$, $Q_8$. The source of transistor $Q_7$ and the drain of transistor $Q_8$ are connected at a third connection point 23.

The output impedance reference circuit 4 is formed of reference resistors Rr and drive transistors $Q_9$ and $Q_{10}$.

The differential receiving circuit 5 receives the output of data accepting and sending circuit 1 and the output of threshold reference circuit 2, detects the voltage difference between the outputs of the data accepting and sending circuit and threshold reference circuit 2, and produces the detected output.

An input end 7 of the data input/output circuit of FIG. 1A is connected to, for example, the data output buffer circuit of a digital apparatus, and a logic signal (0–5 V) of CMOS is supplied to the input end 7. An input/output end 8 is connected to another input/output end 8 of the data input/output circuit of the invention of the opponent's digital apparatus through a single transmission path. Thus, full duplex data transmission is performed between its own digital apparatus and the opponent's digital apparatus. The data which is received from the opponent's digital apparatus through the input/output end 8 is transmitted from an output end 9 to the data input buffer circuit of its own digital apparatus.

The operation of the data input/output circuit will be described below.

A high-level or low-level signal fed at the input end 7 from its own digital apparatus is supplied to the CMOS inverter $Q_{11}$, $Q_{12}$ and CMOS inverter $Q_{13}$, $Q_{14}$ of the data accepting and sending circuit 1. The CMOS inverter $Q_{11}$, $Q_{12}$ connected to the gate of output transistor $Q_1$ and the CMOS inverter $Q_{13}$, $Q_{14}$ connected to the gate of output transistor $Q_2$ are simultaneously operated to produce signals, the levels of which are opposite to that of the signal fed to the input end 7 (i.e., or the level is high when a low level signal is applied to the input end 7 and low when a high level signal is applied thereto.) Thus, when a high level signal is fed to the input end 7, a low level signal is supplied to the gates of the output transistors $Q_1$, $Q_2$ from the CMOS inverter $Q_{11}$, $Q_{12}$ and CMOS inverter $Q_{13}$, $Q_{14}$. The output transistor $Q_2$ (PMOS) is turned on, while the output transistor $Q_2$ (NMOS) is turned off. Therefore, a high level signal is produced at the input/output end 8.

The transistors $Q_3$ and $Q_4$ of the threshold reference circuit 2 which are driven under the same conditions as the output transistors $Q_1$ and $Q_2$ are similarly operated to produce a high level signal at an output end 10. However, the produced high level signal is a divided voltage between the load transistors $Q_5$ and $Q_6$ which are connected as the loads on the transistors $Q_3$ and $Q_4$.

The input ends of the differential receiving circuit 5 are connected to the input/output end 8 and the output end 10, respectively. When no load is connected at the input/output end 8, the high level signal has a level of source voltage $V_{DD2}$ and the low level signal has a level of source voltage $V_{SS2}$. The output of the threshold reference circuit 2 is at the divided voltage. Thus, when a high level signal is applied to the input end 7 of the data accepting and sending circuit 1, the +input end of the differential receiving circuit 5 to which the received data is supplied is at a higher potential than the −input end, with the result that a high level signal is produced at the output end 9 of the differential receiving circuit 5. On the contrary, when a low level signal is applied to the input end 7, a low level signal is produced at the output end 9. The received data from the output end 9 is fed to the data processor of digital apparatus.

The operation of the voltage regulation circuit 3 and output impedance reference circuit 4 will be described below.

Figure 4:
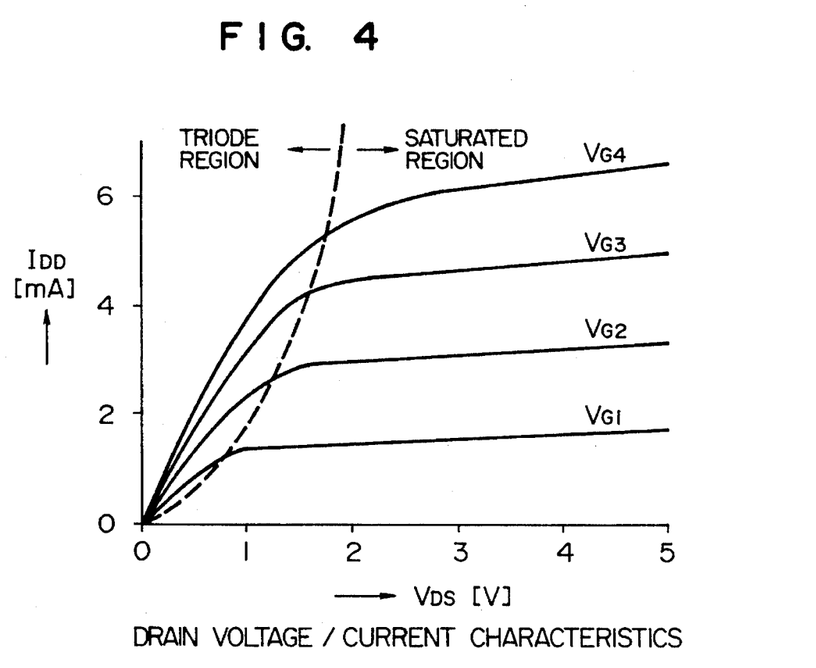
FIG. 4 is a graph showing the drain voltage-current characteristic of the general MOS transistor.

When a bias voltage $V_{c1}$ from the output of the voltage regulation circuit 3 is applied to the gate of the drive transistor $Q_9$ so that the drive transistor $Q_9$ is turned on, a current flows through the reference resistor Rr, thus developing a voltage thereacross. When the drive transistor $Q_9$ is designed to operate in the region in which the drain current-voltage characteristic curve rises up from zero as shown in FIG. 4, it exhibits a resistance characteristic called on-resistance in its conductive state. When the bias voltage $V_{c1}$ applied to the gate of the drive transistor $Q_9$ is adjusted to make the voltage across the reference resistance Rr constant, the on-resistance RDS of the drive transistor $Q_9$ is given by the following equation (1):

$$RDS = Rr\, (V_{DD2}/V_{Rr} - 1)[\Omega] \quad (1)$$

RDS: on-resistance of drive transistor $Q_9$

Rr: reference resistance $V_{DD2}$: power supply voltage $V_{Rr}$: voltage developed across reference resistance Rr In order to make the voltage across the reference resistance Rr constant, the gate voltage of the drive transistor $Q_9$ is adjusted by the voltage regulating circuit 3 which has the differential amplifier 6a and the voltage divider of transistors $Q_7$, $Q_8$ which divides the power supply voltage $V_{DD2}$ to produce a comparison level to the differential amplifier. The output of the reference circuit 4 is connected to the +input end of the differential amplifier 6a and the comparison level is fed to the −input end thereof. The output of the differential amplifier 6a is connected to the gate of the drive transistor $Q_9$, or a negative feedback circuit is formed. If the amplification coefficient of the differential amplifier 6a is high, an imaginary short circuit is formed between the +input end and −input end of the differential amplifier 6a so that the voltage difference between the +input end and −input end is zero. Thus, the voltage developed across the reference resistance Rr equals to the divided voltage level between the transistors $Q_7$ and $Q_8$. As a result, the on-resistance of the drive transistor $Q_9$ is adjusted to be constant. The operation of the drive transistor $Q_{10}$ and the differential amplifier 6b is the same as mentioned above.

The data input/output circuit of the invention which operates as above is incorporated in a CMOS-LSI together with the data input buffer circuit and data output buffer circuit through which data is inputted or outputted from its own or from the opponent's digital apparatus. Its production can be made by well-known techniques and thus will not be described in detail.

The whole circuit operation and full duplex operation will be mentioned in association with the interaction between the circuits.

The output transistor $Q_1$ of the data accepting and sending circuit 1 and the drive transistor $Q_9$ of the output impedance reference circuit 4 are formed by MOS transistors of the same shape, size and characteristics. Similarly, the output transistor $Q_2$ and the drive transistor $Q_{10}$ are formed by MOS transistors of the same shape, size and characteristics. Under these conditions, the same characteristics can be obtained within the LSI which the digital apparatus has and which includes the data input buffer circuit, the data output buffer circuit and the data input/output circuit of the invention. Therefore, if the output voltage $V_{c1}$ of the voltage regulation circuit 3 which makes the on-resistance of the drive transistor $Q_9$ constant is the power supply voltage to the CMOS inverter $Q_{11}$, $Q_{12}$ which makes the output transistor $Q_1$ conductive, the on-resistance of the output transistor $Q_1$ is equal to that of the drive transistor $Q_9$. Similarly, if the output voltage $V_{c2}$ of the voltage regulation circuit 3 which makes the on-resistance of the drive transistor $Q_{10}$ constant is the power supply voltage to the CMOS inverter $Q_{13}$, $Q_{14}$ which makes the output transistor $Q_2$ conductive, the on-resistance of the output transistor $Q_2$ is equal to that of the drive transistor $Q_{10}$.

Here, if the impedance of the transmission line connected to the input/output end 8 is 50 Ω, it is desired that the on-resistance of the output transistors $Q_1$ and $Q_2$ be 50 Ω for impedance matching. As described above, the output impedance reference circuit 4 has the reference resistance Rr and the on-resistance of the output transistors $Q_1$, $Q_2$ can be determined by the equation (1). Thus, if the reference resistance Rr is 50 Ω and if the divided voltage between the transistors $Q_7$, $Q_8$ is $V_{DD2}/2$, the on-resistance of the output transistors $Q_1$ and $Q_2$ can be selected to be 50 Ω. (If the transistors $Q_7$ and $Q_8$ are designed to have the same shape, size and characteristics, the divided voltage can be easily selected to be $V_{DD2}/2$.)

The full duplex operation is made by a pair of data input/output circuits of the invention which are connected to each other through a single transmission line.

When the data accepting and sending circuit 1 of the data input/output circuit of the invention which its own digital apparatus has makes a switching operation to send a pulse, the output transistors $Q_1$ and $Q_2$ have their on-resistance matched with the impedance of the transmission line by the above-mentioned operation. Thus, a pulse having an amplitude of $V_{DD2}2$ is supplied from the input/output end 8 to the data input/output circuit of the invention which the opponent's digital apparatus has.

The gate width of the transistor $Q_3$ of the threshold reference circuit 2 is reduced to be narrower than that of the output transistor $Q_1$ at the time of production. Similarly, the gate width of the transistor $Q_4$ is reduced to be narrower than that of the output transistor $Q_2$. When MOS transistors are formed within an LSI which includes the data input buffer circuit and data output buffer circuit of the digital apparatus, the on-resistance increases in inverse proportion to the gate width. Therefore, if the gate widths of the transistors $Q_3$ and $Q_4$ are reduced at the same rate relative to the output transistors $Q_1$ and $Q_2$, the transistors $Q_3$ and $Q_4$ can have the same switching characteristic as the output transistors $Q_1$ and $Q_2$.

In addition, when the load transistors $Q_8$, $Q_6$ are designed to have ½ the gate width of the transistors $Q_3$, $Q_4$, the load transistors $Q_5$, $Q_6$ can have twice the on-resistance of the transistors $Q_3$, $Q_4$. At this time, the output voltage $V_{c1}$ as a gate biasing voltage is applied to the gate of the load transistor $Q_5$, and similarly the output voltage $V_{c2}$ as a gate biasing voltage to the gate of the load transistor $Q_6$.

When the gate width of the transistors $Q_3$, $Q_4$ is selected to be 1/10 that of the output transistors $Q_1$, $Q_2$, the on-resistance of the transistors $Q_3$, $Q_4$ becomes 500 Ω. In addition, the on-resistance of the load transistors $Q_5$, $Q_6$ is twice that on-resistance, or 1 kΩ. When either one of the transistors $Q_3$, $Q_4$ is turned on, a high level signal or low level signal is produced. Since the load transistors $Q_5$, $Q_6$ are always conductive, they divide the voltage difference between the power supply voltages $V_{DD2}$ and $V_{SS2}$.

In addition, since the output end of the transistors $Q_3$ and $Q_4$ is connected to the voltage dividing point between the load transistors $Q_5$ and $Q_6$, the parallel on-resistance of the load transistors $Q_5$, $Q_6$ is connected as a load on the transistors $Q_3$, $Q_4$. The on-resistance of the transistors $Q_3$, $Q_4$ is 500 Ω and the parallel on-resistance of the load transistors $Q_5$, $Q_6$ is also 500 Ω. Thus, when the transistors $Q_3$, $Q_4$ are switched, an amplitude of $(V_{DD2}-V_{SS2})/2$ is observed.

At this time, since the output pulse from the data accepting and sending circuit 1 has an amplitude of $(V_{DD2}-V_{SS2})/2$, no differential signal components are applied to the input ends of the differential receiving circuit 5. Thus, the transmission signal which is supplied from the input/output end 8 to the data input/output circuit of the opponent's digital apparatus can be prevented from being fed around to the differential receiving circuit 5.

The data input/output circuits in its own and in the opponent's digital apparatus make the same full duplex operation. Thus, the output impedance of the opponent's circuit is equal to 50 Ω of its own circuit. Each output signal from one circuit is terminated at the opponent's circuit. When the output transistor $Q_1$ of the opponent's data accepting and sending circuit 1 is turned on to produce a high level signal and when the output transistor $Q_2$ of its own data accepting and sending circuit 1 is turned on to produce a low level signal, a voltage-divided intermediate-level signal between the high level signal and low level signal, or $((V_{DD2}-V_{SS2})/2)+V_{SS2}$ is observed on the transmission line. On the other hand, the output voltage from the threshold reference circuit 2 is a voltage-divided intermediate value between $((V_{DD2}-V_{SS2})/2)+V_{SS2}$ and $V_{SS2}$, or $((V_{DD2}-V_{SS2})/4)+V_{SS2}$. Since voltages of $((V_{DD2}-V_{SS2})/2)+V_{SS2}$ and $((V_{DD2}-V_{SS2})/4)+V_{SS2}$ are respectively applied to the +input end and −input end of the differential receiving circuit 5, the differential receiving circuit 5 produces a high level signal.

When the data accepting and sending circuit 1 of the data input/output circuit of its own digital apparatus produces the same high level signal as does the data accepting and sending circuit 1 of the data input/output circuit of the opponent's digital apparatus, a high level voltage $V_{DD2}$ is observed on the transmission line. At this time, the output voltage from the threshold reference circuit 2 is $(3(V_{DD2}-V_{SS2})/4)+V_{SS2}$. Voltages of $V_{DD2}$ and $(3(V_{DD2}-V_{SS2})/4)+V_{SS2}$ are respectively applied to the +input end and −input end of the differential receiving circuit 5. The differential receiving circuit 5 produces a high level signal. Thus, the output level from the opponent's digital apparatus can be detected irrespective of the output level from the data accepting and sending circuit 1 of the data input/output circuit of its own digital apparatus. In addition, when the output level from the data accepting and sending circuit of the data input/output circuit of the opponent's digital apparatus is changed to a low level, a low level is received irrespective of the output level from the data accepting and sending circuit 1 of the data input/output circuit of its own digital apparatus.

Thus, the data input/output circuit in this embodiment can receive the output level from the data accepting and sending circuit 1 of the data input/output circuit of the opponent's digital apparatus irrespective of the output level from the data accepting and sending circuit 1 of the data input/output circuit of its own digital apparatus; that is, full duplex operation can be performed.

Figure 2:
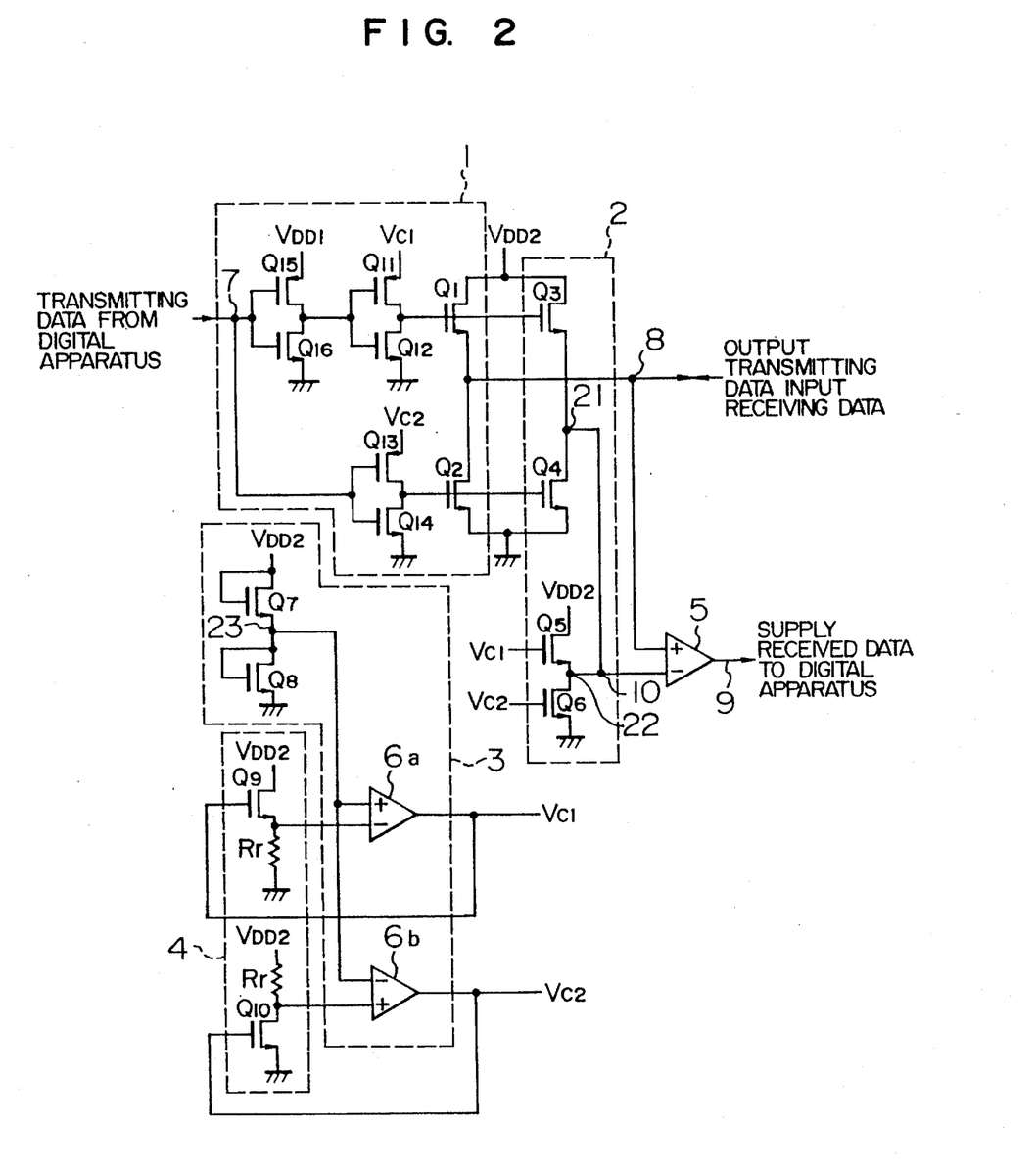
FIG. 2 is a circuit diagram of the data input/output circuit of the second embodiment of the invention.

FIG. 2 shows the second embodiment of the invention. In this embodiment, NMOS transistors are used in place of the PMOS transistors $Q_1$, $Q_3$, $Q_5$ and $Q_9$.

Also, in this embodiment, since the PMOS arrangement is replaced by the NMOS arrangement, a CMOS inverter of transistors $Q_{15}$, $Q_{16}$ is inserted between the input end 7 and the CMOS inverter of transistors $Q_{11}$, $Q_{12}$ for driving the first output transistor $Q_1$ of the data accepting and sending circuit 1. The other portions are the same as in FIG. 1A, and the operation of this embodiment is also the same as mentioned in the first embodiment.

Figure 3:
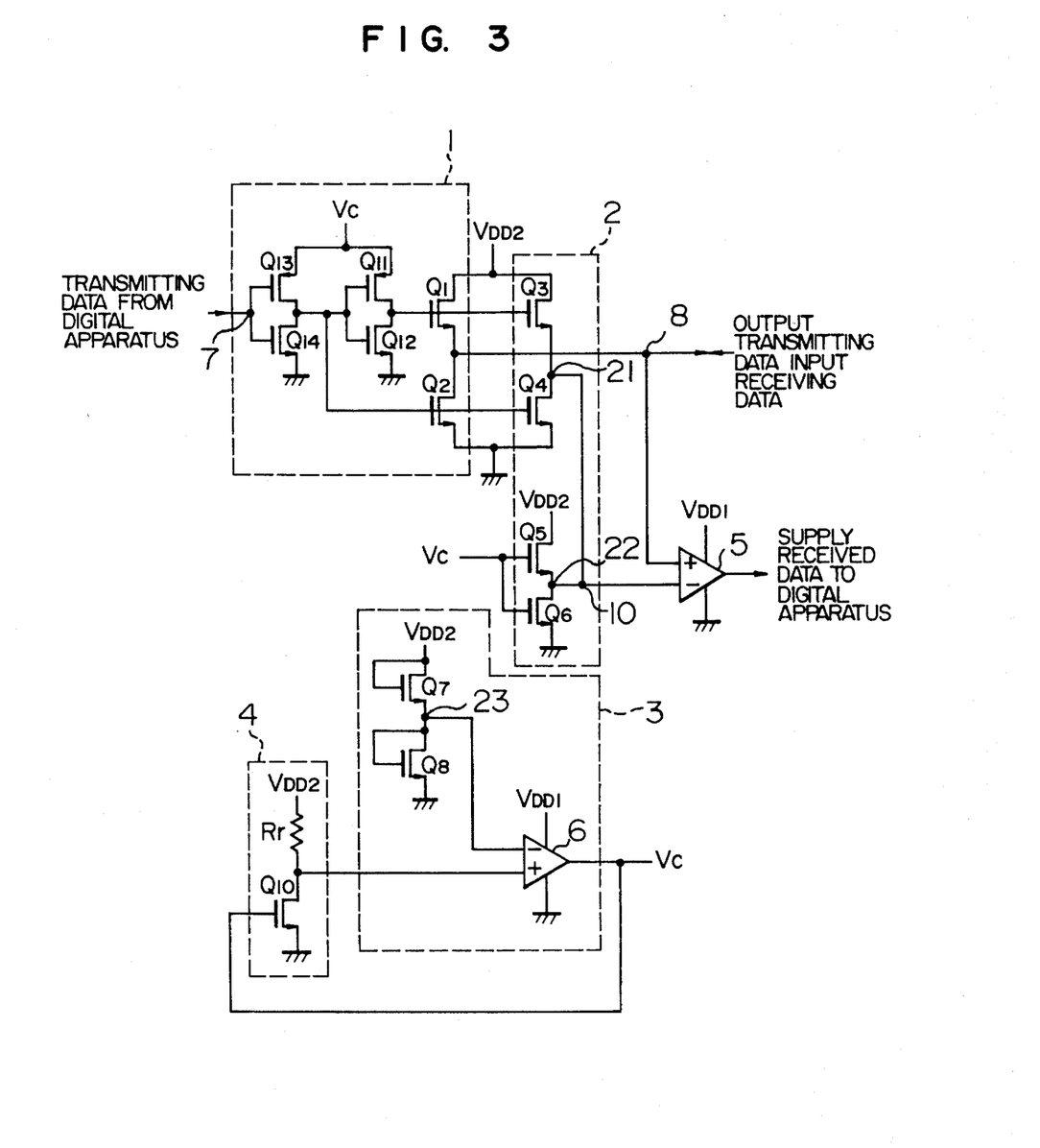
FIG. 3 is a circuit diagram of the data input/output circuit of the third embodiment of the invention.

FIG. 3 shows the third embodiment of the invention. In this embodiment, the gate widths are adjusted at the time of production so that each of the transistors $Q_1$, $Q_2$, transistors $Q_3$, $Q_4$ and transistors $Q_5$, $Q_6$ exhibits the same impedance when the same bias voltage $V_c$ is applied to the gates of the transistors $Q_1$, $Q_3$, $Q_5$ in the second embodiment. In addition, a single set of reference resistance Rr and drive transistor $Q_{10}$ is provided in the output impedance reference circuit 4, and a single differential amplifier circuit 6 is used in the voltage regulation circuit 3. The other portions are the same as in FIG. 2.

When the transistors $Q_1$, $Q_3$, $Q_5$ are formed by NMOS transistors, it is necessary that the drain voltage be reduced to be the threshold voltage of MOS transistors or above, but smaller than the gate voltage, in order to make operation in the region in which the drain current-voltage characteristic curve rises up from zero as shown in FIG. 4. Thus, a power supply voltage of a lower value than the power supply for driving the gates of the CMOS transistors $Q_{11}$, $Q_{12}$, $Q_{13}$, $Q_{14}$ must be applied to the data accepting and sending circuit 1 and threshold reference circuit 2. In this embodiment, the power supply voltage Vc separate from $V_{DD1}$, $V_{DD2}$ is applied thereto.

Figure 5A:
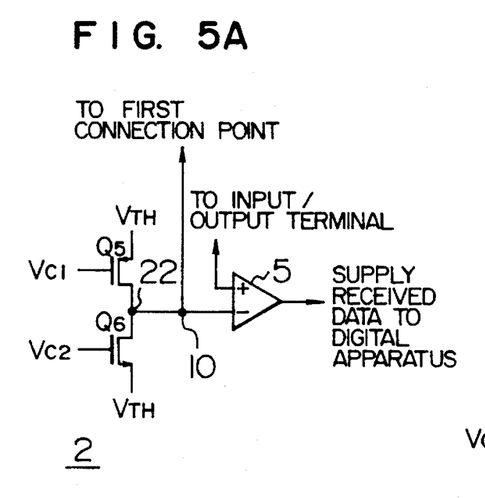
FIG. 5A is a circuit diagram of another example of the threshold/reference circuit.
Figure 5B:
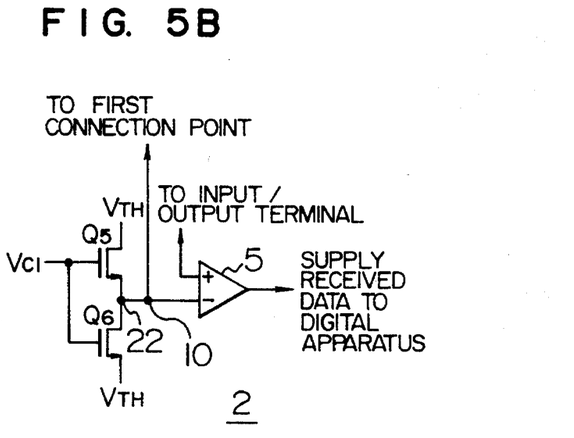
FIG. 5B is a circuit diagram of still another example of the threshold/reference circuit.

FIGS. 5A and 5B show arrangements of the threshold reference circuit 2 in this invention. In the first embodiment (FIG. 5A) and third embodiment (FIG. 5B), a power supply voltage VTH different from voltages $V_{DD2}$, $V_{SS2}$ and ground potential is applied to the sources of the load transistors $Q_3$ and $Q_6$. The level of the voltage $V_{TH}$ is selected to be an intermediate value between the high level signal and low level signal fed from the data accepting and sending circuit 1, thereby making the same operation as in the first embodiment. The output end 10 in FIG. 5A is connected to the first connection point 21 in FIG. 1A and the output end 10 in FIG. 5B to the first connection point 21 in FIG. 2.

In addition, the on-resistance of the load transistor $Q_6$ is formed together with the transistor $Q_4$ and a power supply voltage of $V_{TH}$ is applied to the load transistor $Q_6$, thereby achieving the operation of the threshold reference circuit 2 as for example shown in FIG. 1A.

While in the above embodiment the data input/output circuit is formed by MOS transistors, it may be formed by bipolar transistors. However, since the bipolar transistor is sensitive to temperature change, the circuit arrangement for the correction becomes complicated. In addition, the data input/output circuit may be formed by FETs.

The digital apparatus described hereinbefore may include such as digital communication apparatus, personal computers and the like, these apparatus may also be connected to a LAN transmission path, as well as a WAN, through a communication terminal device. In the above cases, the data input/output circuit of the present invention can be incorporated into an input/output portion of the communication terminal device, as well as of the digital communication apparatus and personal computer.

This invention is not limited to the above embodiments but can of course assume other various modifications without departing from the scope of the invention.

What is claimed is:

1. A data input/output circuit for full duplex communication incorporated in each of a plurality of digital apparatus in order for data to be transmitted among said digital apparatuses, comprising:

a data accepting and sending circuit including an input/output terminal connected to a data processor provided within said digital apparatus, receiving transmitted data from said data processor, transmitting said data and receiving received data from the external through said input/output terminal;

a threshold reference circuit dividing a voltage level of said data transmitted from said data accepting and sending circuit and producing a divided certain voltage level;

a differential receiving circuit including one input terminal connected to said input/output terminal and the other input terminal connected to said threshold reference circuit, and being not operated by a zero voltage difference between said one input terminal and said other input terminal when said data is transmitted from said input/output terminal but operated by a voltage difference between said one input terminal and said other terminal when said data from the external is received through said input/output terminal, said received data being supplied to said data processor of said digital apparatus;

an output impedance reference circuit for generating a predetermined value of the output impedance of said data accepting and sending circuit; and a voltage regulation circuit for adjusting at least a power supply voltage to be applied to said data accepting and sending circuit so that an output impedance value of said data accepting and sending circuit is changed in accordance with said predetermined value of said output impedance.

2. A data input/output circuit according to claim 1, wherein said data accepting and sending circuit has first and second CMOS transistor pairs connected in parallel with an input terminal for receiving said transmitted data from said data processor, the output end of the first CMOS transistor pair being connected to the gate of a first PMOS transistor, the output end of the second CMOS transistor pair being connected to the gate of a first NMOS transistor, the drain of said first PMOS transistor and the drain of said first NMOS transistor being connected together at said input/output terminal.

3. A data input/output circuit according to claim 2, wherein said threshold reference circuit includes:

a second PMOS transistor, a gate of which is connected to the gate of said first PMOS transistor and a second NMOS transistor, a gate of which is connected to the gate of said first NMOS transistor, the drain of said second PMOS transistor and the drain of said second NMOS transistor being connected together at a first connection point, the source of said first PMOS transistor and the source of said second PMOS transistor being connected at a power supply, the source of said first NMOS transistor and the source of said second NMOS transistor being connected at another power supply; and a third PMOS transistor and a third NMOS transistor, the drain of said third PMOS transistor and the drain of said third NMOS transistor being connected together at a second connection point, said second connection point being connected to said first connection point so that a voltage level of said transmitted data from said input/output terminal is divided at said second connection point.

4. A data input/output circuit according to claim 3, wherein said differential receiving circuit is a differential amplifier having a +input terminal connected to said input/output terminal and a −input terminal connected to said second connection point, and being operated by a voltage difference between said +input terminal and said −input terminal when said received data is received at said input/output terminal so that said received data is supplied to said data processor of said digital apparatus, but, when data is transmitted from said input/output terminal, being not operated by a zero difference voltage between a voltage level of said transmitted data and a divided part of said voltage level of said transmitted data produced at said second connection point.

5. A data input/output circuit according to claim 4, wherein said output impedance reference circuit has a fourth PMOS transistor with a reference resistance connected to a drain of said fourth PMOS transistor, and a fourth NMOS transistor with another reference resistance connected to a drain of said fourth NMOS transistor, so that a voltage is developed across each reference resistance in accordance with a voltage applied to each gate.

6. A data input/output circuit according to claim 5, wherein said voltage regulation circuit has a fifth NMOS transistor and a sixth NMOS transistor, the source of said fifth NMOS transistor and the drain of said sixth NMOS transistor being connected together at a third connection point, a first differential amplifier having a −input terminal connected to said third connection point and a +input terminal connected to the drain of said fourth PMOS transistor, and a second differential amplifier having a −input terminal connected to said third connection point and a +input terminal connected to the drain of said fourth NMOS transistor, the output voltage from said first differential amplifier being negatively fed back to the gate of said fourth PMOS transistor and supplied as a power supply voltage to said first CMOS transistor pair, the output voltage from said second differential amplifier being negatively fed back to the gate of said fourth NMOS transistor and supplied as a power supply voltage to said second CMOS transistor pair.

7. A data input/output circuit according to claim 6, wherein the output voltage from said first differential amplifier is applied to the gate of said third PMOS transistor and the output voltage from said second differential amplifier is applied to the gate of said third NMOS transistor.

8. A data input/output circuit according to claim 1, wherein said data accepting and sending circuit includes:

a first CMOS transistor pair, a common gate of which is connected to said input terminal for said transmitted data from said data processor;

a second CMOS transistor pair, a common gate of which is connected to the common output of said first CMOS transistor pair;

a first NMOS transistor, the gate of which is connected to the common output of said second CMOS transistor pair; and a second NMOS transistor, the gate of which is connected to the common output of said first CMOS transistor pair in parallel with said second CMOS transistor pair;

wherein the drain of said second NMOS transistor is connected to the source of said first NMOS transistor and to said input/output terminal.

9. A data input/output circuit according to claim 8, wherein said threshold reference circuit has:

a third NMOS transistor, the gate of which is connected to the gate of said first NMOS transistor;

a fourth NMOS transistor, the gate of which is connected to the gate of said second NMOS transistor, wherein the source of said third NMOS transistor and the drain of said fourth NMOS transistor are connected together at said first connection point, the drain of said first NMOS transistor and the drain of said third NMOS transistor are connected to a power supply, and the source of said second NMOS transistor and the source of said fourth NMOS transistor are grounded together; and fifth and sixth NMOS transistors, wherein the gate of said fifth NMOS transistor are connected to the gate of said sixth NMOS transistor, the source of said fifth NMOS transistor and the drain of said sixth NMOS transistor are connected together at said second connection point, and said second connection point is connected to said first connection point so that the voltage level of said transmitted data from said input/output terminal is divided at said second connection point.

10. A data input/output circuit according to claim 9, wherein said output impedance reference circuit has a seventh NMOS transistor of which the drain is connected to a reference resistance so that a voltage is developed across said reference resistance in accordance with the voltage applied to the gate of said seventh NMOS transistor.

11. A data input/output circuit according to claim 10, wherein said voltage regulation circuit includes eighth and ninth NMOS transistors and an operational amplifier, which has a −input terminal connected to a third connection point at which the source of said eighth NMOS transistor and the drain of said ninth NMOS transistor are connected together, and a +terminal connected to the drain of said seventh NMOS transistor;

wherein the output voltage from said operational amplifier is negatively fed back to the gate of said seventh NMOS transistor, supplied as a power supply voltage to said first and second CMOS transistor pairs, and supplied to the gates of said fifth and sixth NMOS transistors.

12. A data input/output circuit according to claim 3, wherein the source voltage of said third PMOS transistor and the source voltage of said third NMOS transistor are selected to be an intermediate value between the high level signal and low level signal of said transmitted data from said input/output terminal.

13. A data input/output circuit according to claim 1, wherein a data processor of each said digital apparatus includes an output buffer circuit of CMOS structure which temporarily stores data transmitted from said digital apparatus and transmits the temporarily stored data to said input terminal, and an input buffer circuit of CMOS structure which temporarily stores data received from said input/output terminal of an external digital apparatus, said output buffer circuit and input buffer circuit of CMOS structure being incorporated in a single LSI (Large-Scaled Integrated circuit) together with said data accepting and sending circuit, said threshold reference circuit, said differential receiving circuit, said output impedance reference circuit and said voltage regulation circuit.

14. A data input/output circuit according to claim 1, wherein said data accepting and sending circuit includes:

a first CMOS transistor pair, a common gate of which is connected to an input terminal for receiving said data transmitted from said data processor;

a second CMOS transistor pair, a common gate of which is connected to the common output of said first CMOS transistor pair;

a first NMOS transistor, the gate of which is connected to the common output of said second CMOS transistor pair;

a third CMOS transistor pair, a common gate of which is connected to said input terminal in parallel with said first and second CMOS transistor pairs; and a second NMOS transistor, the gate of which is connected to the common output of said third CMOS transistor pair;

wherein the source of said first NMOS transistor and the drain of said second NMOS transistor are connected together at said input/output terminal.

15. A data input/output circuit according to claim 14, said threshold reference circuit having:

a third NMOS transistor, the gate of which is connected to the gate of said first NMOS transistor;

a fourth NMOS transistor, the gate of which is connected to the gate of said second NMOS transistor wherein the source of the third NMOS transistor and the drain of the fourth NMOS transistor are connected together at a first connection point; and fifth and sixth NMOS transistors whose source and drain are respectively connected together at a second connection point wherein said first and second connection points are connected together so that the voltage level of the transmitted data from said input/output terminal is divided at said second connection point.

16. A data input/output circuit according to claim 15, wherein said output impedance reference circuit has a seventh NMOS transistor and an eighth NMOS transistor, the drain of which is connected to a reference resistance;

wherein the source of said seventh NMOS transistor and the drain of said eighth NMOS transistor are connected to respective reference resistances such that a voltage developed across each reference resistance accords with the voltage applied to each gate of said seventh and eighth NMOS transistors, respectively;

wherein said voltage regulation circuit has a first differential amplifier having a +input terminal connected to said third connection point and a −input terminal connected to the source of said seventh NMOS transistor, and a second differential amplifier having a −input terminal connected to said third connection point and a +input terminal connected to the drain of said eighth NMOS transistor;

wherein the output voltage from said first differential amplifier is negatively fed back to the gate of said seventh NMOS transistor and supplied as a power supply voltage to said third CMOS transistor pair; and wherein the output voltage from said second differential amplifier is negatively fed back to the gate of said eighth NMOS transistor and supplied as a power supply voltage to said third CMOS transistor pair.

17. A data input/output circuit according to claim 11, wherein said first, second, third, fourth, fifth, and sixth NMOS transistors exhibit the same impedance when the output voltage from said operational amplifier is supplied to the gates of said first, third, and fifth NMOS transistors in accordance with said operational amplifier being supplied as said power supply voltage to said first and second CMOS transistor pairs and to the gates of said fifth and sixth NMOS transistors.

18. A data input/output circuit according to claim 16, wherein said differential receiving circuit is a differential amplifier having a +input terminal connected to said input/output terminal and a −input terminal connected to said second connection point, and being operated by a voltage difference between said +input terminal and said −input terminal when said received data is received at said input/output terminal so that said received data is supplied to said data processor of said digital apparatus, but, when data is transmitted from said input/output terminal, being not operated by a zero difference voltage between a voltage level of said transmitted data and a divided part of said voltage level of said transmitted data produced at said second connection point.

19. A data input/output circuit according to claim 11, wherein said differential receiving circuit is a differential amplifier having a +input terminal connected to said input/output terminal and a −input terminal connected to said second connection point, and being operated by a voltage difference between said +input terminal and said −input terminal when said received data is received at said input/output terminal so that said received data is supplied to said data processor of said digital apparatus, but, when data is transmitted from said input/output terminal, being not operated by a zero difference voltage between a voltage level of said transmitted data and a divided part of said voltage level of said transmitted data produced at said second connection point.

20. A data input/output circuit according to claim 15, wherein said output impedance reference circuit has a seventh NMOS transistor, a source of which is connected to a reference resistance, and an eighth NMOS transistor, the drain of which is connected to another reference resistance, thus a voltage being developed across each reference resistance in accordance with the voltage applied to each gate.

21. A data input/output circuit according to claim 15, wherein the drain voltage of said fifth NMOS transistor and the source voltage of said sixth NMOS transistor are selected to be an intermediate value between the high level signal and low level signal of said transmitted data from said input/output terminal.

* * * * *